United States Patent
Hill

(10) Patent No.: US 7,483,824 B1
(45) Date of Patent: Jan. 27, 2009

(54) SELF-CHECKING TEST GENERATOR FOR PARTIALLY-MODELED PROCESSORS BY PROPAGATING FUZZY STATES

(75) Inventor: Eric L. Hill, Palo Alto, CA (US)

(73) Assignee: Azul Systems, Inc., Mountain View, CA (US)

( * ) Notice: Subject to any disclaimer, the term of this patent is extended or adjusted under 35 U.S.C. 154(b) by 341 days.

(21) Appl. No.: 11/308,039

(22) Filed: Mar. 3, 2006

(51) Int. Cl.
*G06F 17/50* (2006.01)

(52) U.S. Cl. .................. 703/14; 714/733; 714/742; 714/718; 714/741; 438/14; 703/15; 716/4

(58) Field of Classification Search ............ 703/14, 703/15; 438/14; 700/299, 110; 714/733, 714/742, 718, 741, 738; 702/117; 716/4; 707/1
See application file for complete search history.

(56) References Cited

U.S. PATENT DOCUMENTS

| | | | |
|---|---|---|---|
| 5,446,652 A | 8/1995 | Peterson et al. | 703/6 |
| 5,475,694 A | 12/1995 | Ivanov et al. | 714/732 |
| 5,699,488 A | 12/1997 | Viot et al. | 706/59 |
| 5,729,554 A | 3/1998 | Weir et al. | 714/739 |
| 5,864,658 A | 1/1999 | Theobald | 714/25 |
| 6,049,662 A | 4/2000 | Saha et al. | 703/16 |
| 6,175,946 B1 | 1/2001 | Ly et al. | 716/4 |
| 6,240,329 B1* | 5/2001 | Sun | 700/110 |
| 6,347,388 B1 | 2/2002 | Hollander | 714/739 |
| 6,457,152 B1 | 9/2002 | Paley et al. | 714/738 |
| 6,701,490 B1 | 3/2004 | Talukdar et al. | 716/4 |
| 6,742,166 B2 | 5/2004 | Foster et al. | 716/4 |
| 6,842,883 B2 | 1/2005 | Whitehill | 716/4 |
| 6,973,413 B2 | 12/2005 | Hashemian | 702/183 |
| 2001/0010091 A1 | 7/2001 | Noy | 714/25 |
| 2002/0002698 A1* | 1/2002 | Hekmatpour | 716/4 |
| 2002/0155628 A1* | 10/2002 | Bulaga et al. | 438/14 |
| 2002/0184560 A1 | 12/2002 | Wang et al. | 714/25 |
| 2003/0203520 A1* | 10/2003 | Worster et al. | 438/14 |
| 2004/0078178 A1* | 4/2004 | Blasi et al. | 703/15 |
| 2004/0078683 A1 | 4/2004 | Buia et al. | 714/37 |
| 2004/0153928 A1 | 8/2004 | Rohrbaugh et al. | 714/738 |
| 2004/0158788 A1* | 8/2004 | Kaszynski et al. | 714/741 |

(Continued)

OTHER PUBLICATIONS

Bird & Munoz, "Automatic generation of random self-checking test cases", IBM Systems Journal, vol. 22, No. 3, 1983, p. 229-245.

(Continued)

*Primary Examiner*—Kandasamy Thangavelu
(74) *Attorney, Agent, or Firm*—Stuart T. Auvinen; g Patent LLC

(57) ABSTRACT

A self-checking test generator program creates a self-checking test program that can test a device under test (DUT). The self-checking test generator selects instructions for a test. Selected instructions are executed on a software DUT model to generate results that can be self-checked by other instructions such as compare and branch instructions. The software DUT model has fuzzy models and unknown models for blocks in the DUT. Fuzzy models generate expected outputs for a block of the DUT. Fuzzy models may propagate unknown data from their inputs to their outputs. Unknown models do not predict expected outputs. Instead, unknown models always output unknown (X). Over time, as more of the DUT logic is modeled, unknown models may be replaced with fuzzy models.

20 Claims, 9 Drawing Sheets

U.S. PATENT DOCUMENTS

| | | | |
|---|---|---|---|
| 2004/0162805 A1* | 8/2004 | Wozniak | 707/1 |
| 2005/0086566 A1* | 4/2005 | Thompson et al. | 714/741 |
| 2006/0005094 A1* | 1/2006 | Nozuyama | 714/738 |
| 2006/0064268 A1* | 3/2006 | Dorough et al. | 702/117 |
| 2006/0156144 A1* | 7/2006 | Cheng et al. | 714/742 |
| 2006/0178784 A1* | 8/2006 | Stewart et al. | 700/299 |
| 2006/0179377 A1* | 8/2006 | Dawson et al. | 714/733 |
| 2006/0195746 A1* | 8/2006 | Cooke et al. | 714/741 |
| 2006/0200713 A1* | 9/2006 | Slobodnik et al. | 714/718 |
| 2006/0212768 A1* | 9/2006 | Ishida | 714/733 |
| 2007/0204193 A1* | 8/2007 | Grise et al. | 714/733 |

OTHER PUBLICATIONS

Poe, "Introduction to Random Test Generation for Processor Verification", Obsidian Software, 7 pp, 2002.

* cited by examiner

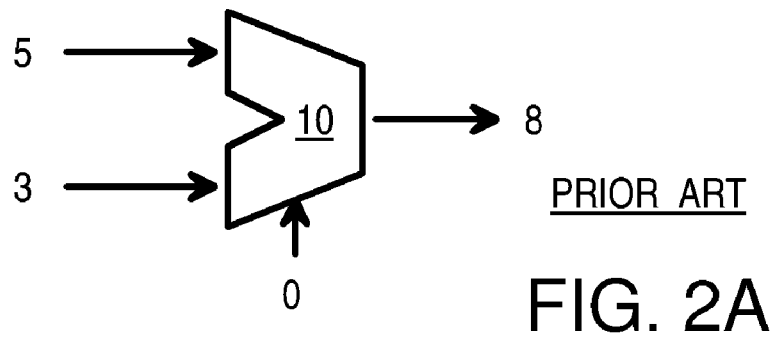
PRIOR ART
FIG. 2A
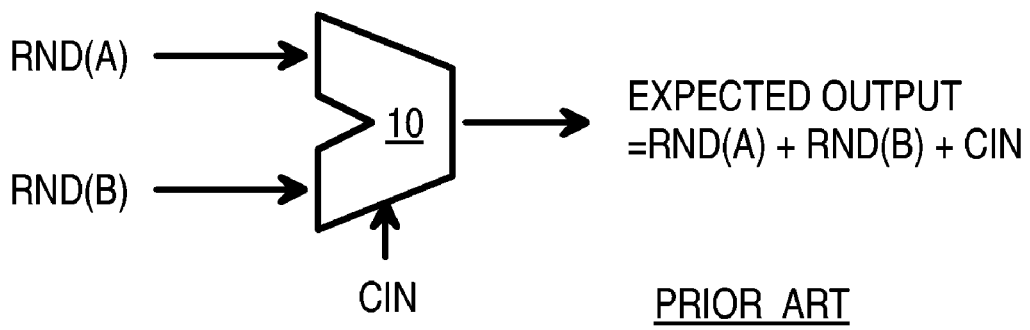
EXPECTED OUTPUT
=RND(A) + RND(B) + CIN
PRIOR ART
FIG. 2B
```
* ADD MODEL;
FOR A=0 TO 100;
  FOR B=0 TO 100;
    CIN=0
    EXP OUT = =RND(A) + RND(B) + CIN
  END;
END;
```
PRIOR ART
FIG. 2C

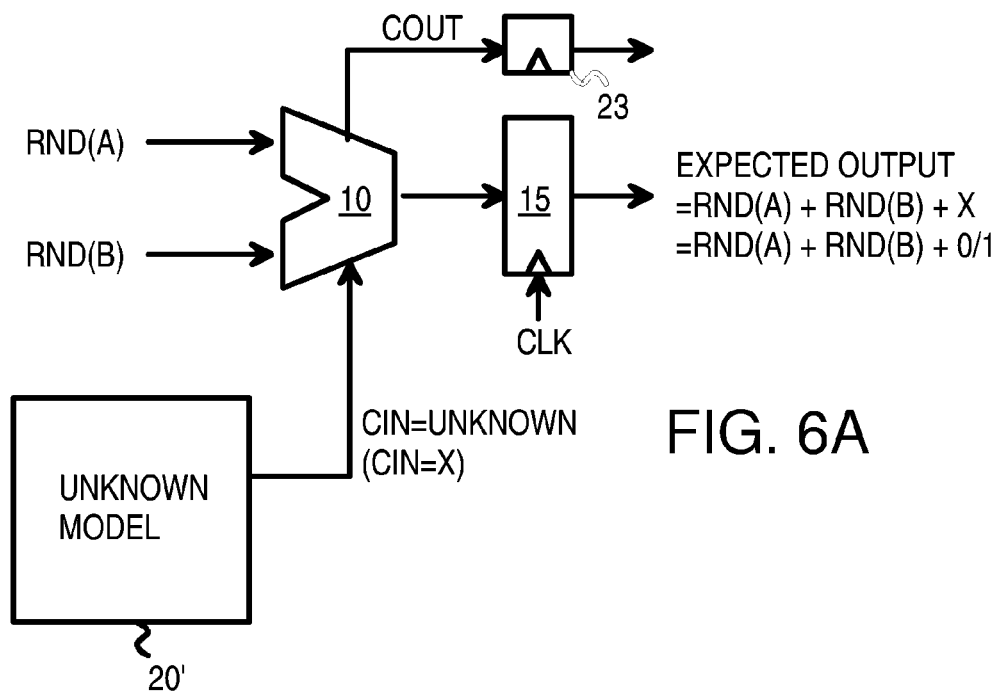
FIG. 6A
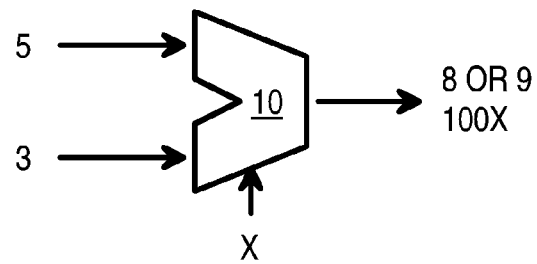
FIG. 6B
```
FOR TEST_VECTORS = 0 TO 3200
    // Generate Add Vector
    A = PICK_OPERAND(CONSTRAINTS)
    B = PICK_OPERAND(CONSTRAINTS)
    // UPDATE MODEL WITH EXPECTED RESULTS
    IF (DUT.CIN == UNKNOWN) THEN
        DUT.OUTPUT = UNKNOWN
        DUT.COUT = UNKNOWN
    ELSE
        DUT.OUTPUT = A + B + DUT.CIN
        DUT.COUT = OVERFLOW(A + B + DUT.CIN)
```
FIG. 6C

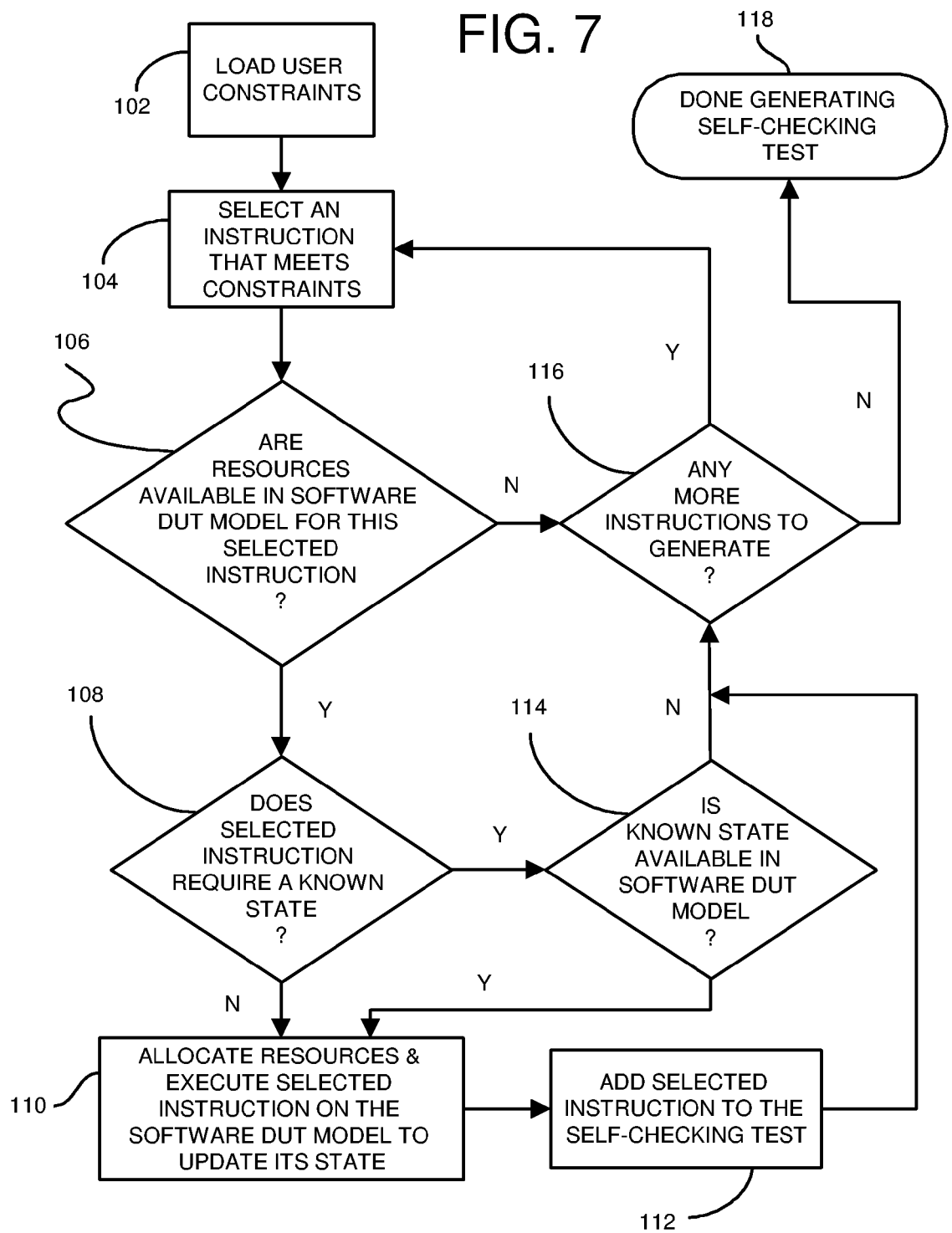

SELF-CHECKING TEST GENERATOR FOR PARTIALLY-MODELED PROCESSORS BY PROPAGATING FUZZY STATES

FIELD OF THE INVENTION

This invention relates to test systems, and more particularly to generating self-checking tests using fuzzy behavioral models.

BACKGROUND OF THE INVENTION

Advances in semiconductor processing and design tools have enabled larger and larger systems to be integrated onto an integrated circuit (IC) chip. Millions of transistors may need to function properly for the system to operate as intended. Testing as many of these transistors as possible is critical to ensuring that end-user systems using the IC are reliable.

Creating test programs that provide adequate coverage of gates and transistors within the chip can be challenging. Most transistors within the chip do not connect directly to the limited number of external input-output I/O leads or "pins". Creation of the test program may begin long before the first prototypes are manufactured.

FIG. 1 illustrates testing before and after first prototypes are available. Traditionally, test patterns were manually generated by the chip designer or test engineer who wrote stimuli (input values) and obtained expected outputs from a logic simulator. Test vectors that have both inputs and expected outputs were then loaded onto to automated tester 14, which applied physical signals to device-under-test 16, and compared outputs generated by device-under-test 16 to the expected outputs. Any mismatches were reported to the test operator and caused the chip to fail.

A probe card that contacts I/O pads on device-under-test 16 on a wafer could be connected to automated tester 14, or a packaged chip could be used as device-under-test 16. However, hundreds of thousands of dollars or more are often required to produce the first prototypes of device-under-test 16. It is often desirable to begin testing before the first prototypes are available.

Pre-first-silicon testing using the test program can begin using testbench 18. Testbench 18 is a simulator that receives the inputs from the test program, and generates outputs that can be compared to the expected outputs from the test program. Testbench 18 could be a hardware-based simulator such as a chassis filled with boards of programmable-logic chips that can be programmed with the logic that is eventually formed on the IC chip, device-under-test 16. Testbench 18 could also be a software-based simulator that executes on a computer. Quickturn (from Cadence) is a hardware emulation system used to test chips before first silicon. VCS (from Synopsys) and NC Verilog (from Cadence) are simulators that compile and simulate behavior RTL code.

As the design is updated, the logic simulated by testbench 18 may be updated, allowing the test engineer to adjust the test vectors to test the updated design. The test vectors may be adjusted to improve coverage of the chip's logic, and additional test vectors may be created before first silicon.

Rather than manually write test vectors, automated tools may be used to create test vectors. A random-number generator may create a series of input values for some of the inputs, such as values for a bus input. Self-checking test generators are one type of test-generation tool that also generate expected outputs. The input values are applied to a model of the device to be tested. The model predicts the expected outputs based on the input values and a current state of the model.

FIGS. 2A-E show self-checking test generation for a simple device. In FIG. 2A adder 10 generates an output that is the sum of two multi-bit inputs and a single-bit carry-in CIN. For example, when the multi-bit input values of 5 and 3 are applied and CIN is 0, the expected output of adder 10 is 8. Adder 10 could eventually be a block on a post-silicon device-under-test chip, but initially could be a model of the device to be tested.

In FIG. 2B, a self-checking test generator uses the model of the device block to generate test inputs and expected outputs. A self-checking test program generates random values to apply to the multi-bit inputs of adder 10, such as by calling a random-number function RND(A) or RND(B). The self-checking test generator accesses a model of adder 10 that predicts the expected output of adder 10, given the applied inputs. For example, the model of adder 10 predicts that the expected output is the sum of the two multi-bit inputs and the carry-in, or RND(A)+RND(B)+CIN.

The model for adder 10 could be called by the self-checking test-generating program, or could be written directly into the self-checking test program as shown in the simplified pseudo-code of FIG. 2C. In FIG. 2C, nested loops are used to generate a series of seed values A, B for the random number functions. The carry-in is set to 0. The model for adder 10 is expressed in the code statement:

EXP_OUT==RND(A)+RND(B)+CIN

The expected output for adder 10 is the sum of the random multi-bit values generated from seed values A, B, and the carry-in CIN.

In FIG. 2D, a common problem with self-checking test generator programs is shown. Self-checking test generators need to predict results of the generated test vectors. To predict results the self-checking test generators must model the device under test. Creating an exact software model of the design under test (DUT) is often a difficult undertaking. For complex designs with short schedules it is not practical to create an exact model. For these reasons it is practical to model the important design behaviors and leave the less important features un-modeled. FIG. 2D is an example where CIN from unmodeled logic 20 is not modeled by the self-checking test generator while adder 10 is modeled.

Since the expected output of adder 10 is the sum of the three inputs to adder 10, and one of the three inputs, CIN, is unknown because of unmodeled logic 20, the expected output of adder 20 is not able to be generated by the self-checking test generator program. This is a problem that must be solved for self-checking to be useful. Solving this problem is not as simple as ignoring the unknown output of this one adder. In most complex designs unknown outputs will propagate to many other parts of the design. It is possible to ignore all states that unknown logic may propagate to, but this may result in ignoring most of the design. Furthermore, this ignores many operations that are modeled that could have been checked if the inputs were known.

A fix to unknown signals is shown in FIG. 2E. Often it is possible to constrain the random test generation to ensure some states never occur. FIG. 2E depicts this case where CIN is forced to 0. It is easy to model the behavior "CIN=0" so that the complex modeling problem has been avoided.

There are several methods for constraining the generated test to force an input to a specific value. Occasionally it is as simple as disabling a mode of operation. Other times it requires creating additional constraints for the random test generation. For example, if negative-number sums are too difficult to model, then the test generator could be set to generate only positive-number inputs.

Constraining test generation to avoid a specific case is undesirable. While such constraints may solve the complex modeling problem, some logic may not be fully tested. This solution leaves a coverage hole where some of the design is not tested. These intentional coverage holes are dangerous because bugs may reside in the logic that is untested. To solve this coverage-hole problem, test engineers may create additional tests to ensure no area goes untested. This is undesirable additional work.

What is desired is a self-checking test generator program for use with unmodeled logic. A self-checking test generator program that handles unknown states from unmodeled logic is desirable. A more automated self-checking test generator program that does not require the test engineer to constrain test generation to produce known states is desirable.

BRIEF DESCRIPTION OF THE DRAWINGS

FIGS. 2A-E show self-checking test generation for a simple device.

FIGS. 6A-C show an example of fuzzy models used by a self-checking test generator program.

FIG. 7 is a flowchart of operation of a self-checking test generator that uses fuzzy models.

DETAILED DESCRIPTION

The present invention relates to an improvement in self-checking test generator programs. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that fuzzy models that explicitly handle unknown states may be used with self-checking test generator programs. In particular, "unknown models" for unmodeled logic are used to generate unknown states before the logic is modeled.

Models for logic blocks that have already been designed and modeled are updated to allow for inputs in the unknown states. Unknown inputs may propagate to the outputs of these modeled logic blocks, allowing unknowns generated by unmodeled logic to propagate through modeled blocks.

A self-checking test generator program may automatically generate test vectors with expected outputs by using fuzzy models for blocks in the device to be tested. Unknown states that are propagated to chip outputs may be ignored during actual testing of a device.

The inventor has further realized that such fuzzy modeling used by a self-checking test generator program is ideal for larger, more complex designs such as microprocessors and system chips that contain processor cores. Test-program development may begin much earlier in the design cycle when self-checking test generator programs are used with fuzzy models, since self-checking test generator programs may be written and debugged without an exact model of the design under test. Some block may not be modeled before first silicon, or may be incompletely modeled. The complexity of some blocks may make modeling of these blocks for testing too prohibitively expensive.

Figure 1:
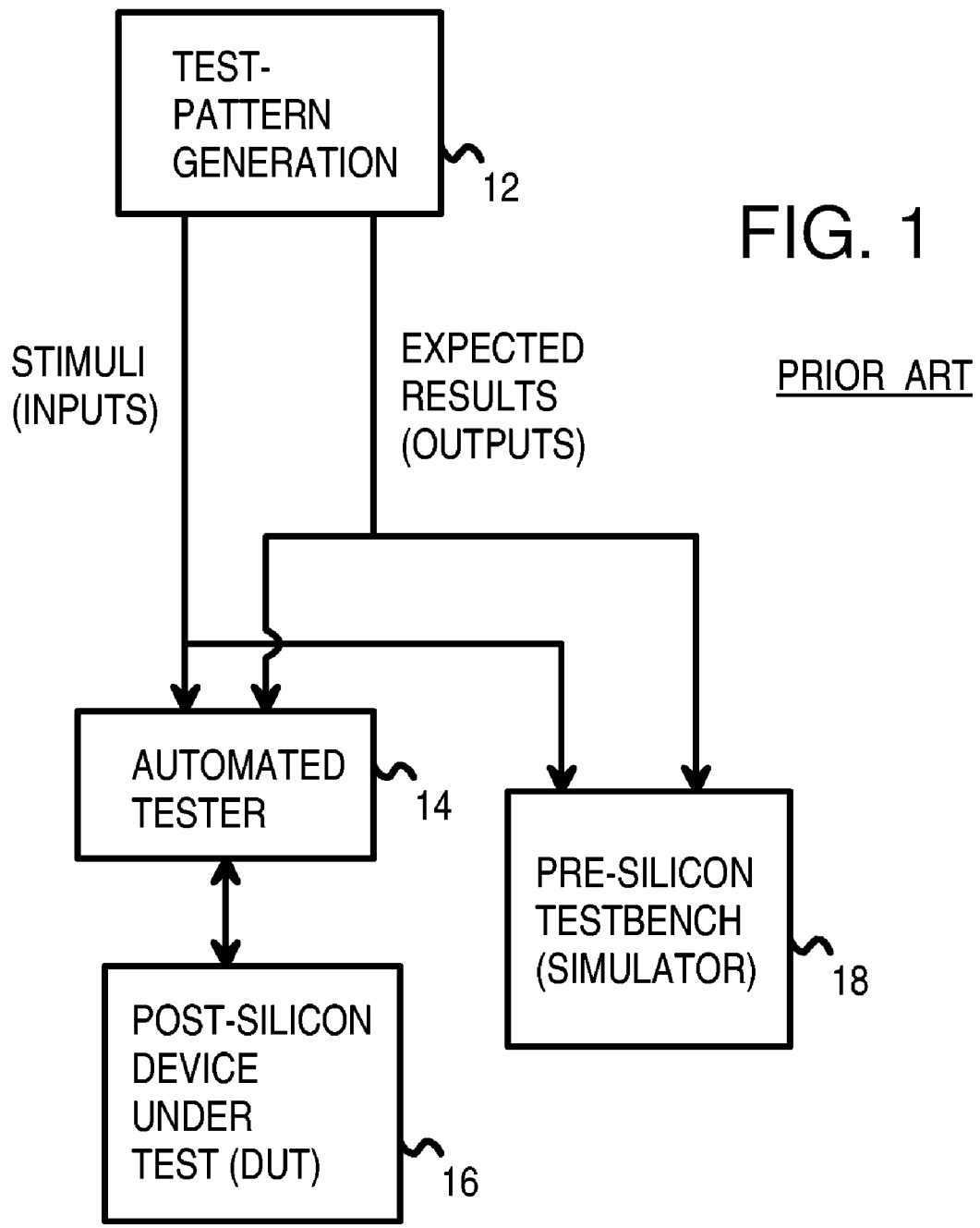
FIG. 1 illustrates testing before and after first prototypes are available.
Figure 2D:
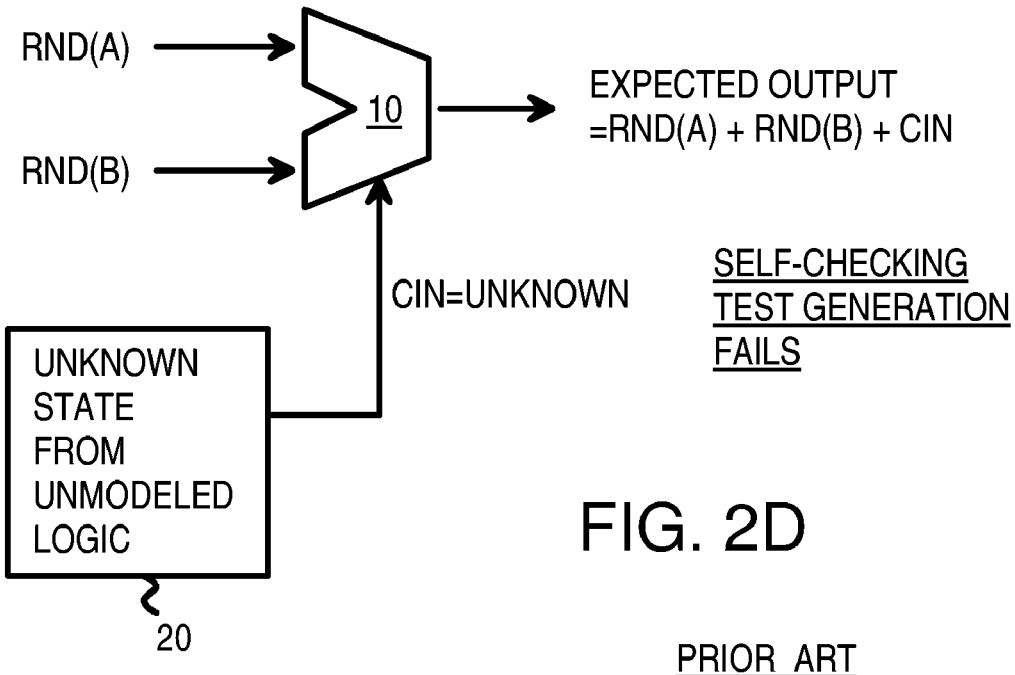
Figure 2E:
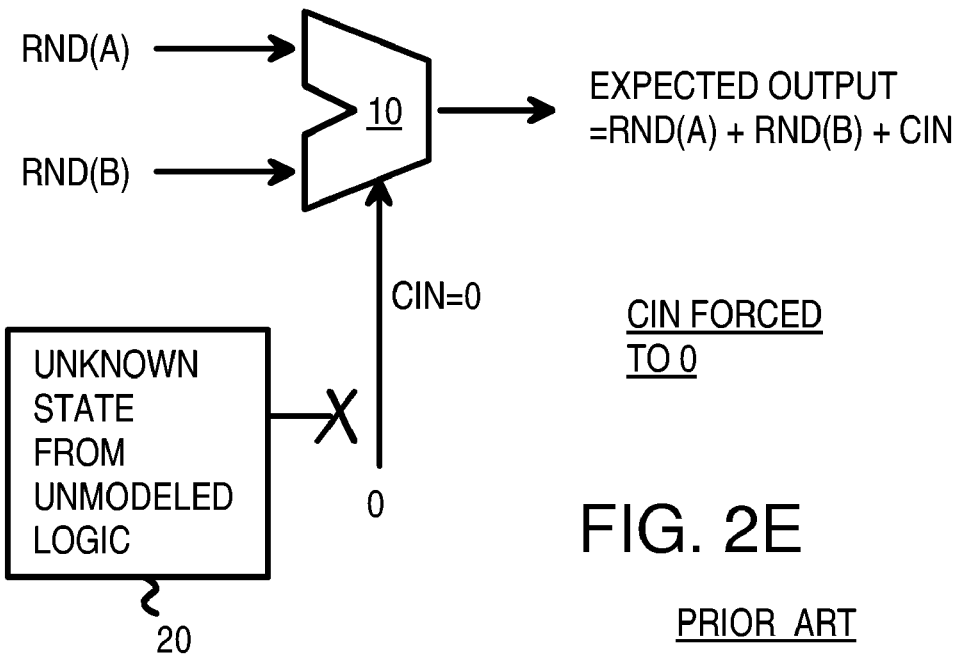
Figure 3:
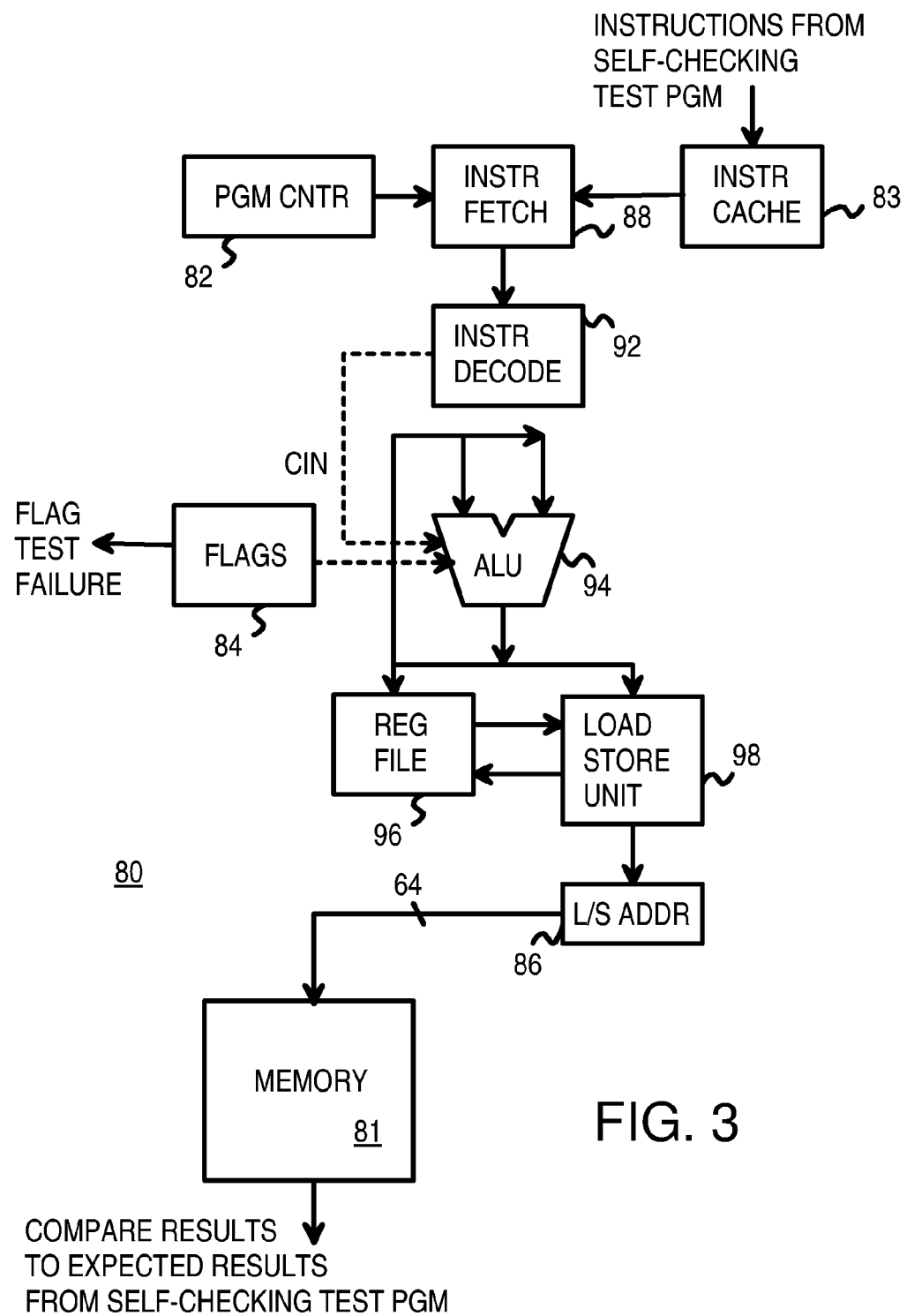
FIG. 3 is a diagram highlighting a test program executing on a processor core block.

FIG. 3 is a diagram highlighting a test program executing on a processor core block. CPU 80 may be one of many blocks in a system chip that may also have caches, various controllers, and other blocks. Test programs created by a self-checking test generator program may also be used to test these other blocks (not shown).

Program counter 82 contains part of an instruction's address and is typically advanced by the instruction length for each sequential instruction fetched. Program counter 82 is loaded with a branch address when program branching occurs. The instruction address is generated from program counter 82 and the instruction is fetched by instruction fetcher 88 and decoded by instruction decoder 92.

The test inputs from a test program created by a self-checking test generator program are loaded into instruction cache 83. These test inputs loaded into instruction cache 83 are instructions that can be decoded and executed by CPU 80. These instructions from the test program are then fetched by instruction fetcher 88 in a sequence determined by sequentially advancing program counter 82 or by loading branch target addresses into program counter 82 when branches are taken.

Arithmetic-logic-unit ALU 94 reads operands from register file 96, performs an operation indicated by the decoded instruction, and writes the result either back to register file 96, or to memory through load-store unit 98. Load-store address 86 generated by load-store unit 98 causes the results of the test program being executed by CPU 80 to be written to memory 81. For example, data results of the test program may be written to a block within memory 81.

The test results stored into memory 81 may be scanned out by specialized test logic, or may be written to a dummy external memory that is really an external tester. The external tester may compare the test results read from memory 81 with expected test results to determine when a test failure has occurred, such as when some logic in CPU 80 has a physical fault. The expected test results may be generated by the self-checking test generator program that generated the test-program instructions that were loaded into instruction cache 83.

Another way to detect chip failures is to examine flags 84 and/or the contents of register file 96 that are generated by CPU 80 during test-program instruction execution. For example, an overflow flag generated by ALU 94 could signal a physical defect when the self-checking test generator program does not cause an overflow. ALU 94 could compare values generated earlier in the test program being executed on CPU 80, and flags 84 could be set on the compare results such as greater than or equal. The compare, overflow, or other result in flags 84 could also alter program flow, such as by causing a branch to be taken when an overflow or a mis-compare occurs. This branching on flags 84 could be a branch-on-failure that halts execution of the test program by CPU 80, or that sets an external pin such as an external interrupt or status bit that can be read by an external tester.

Thus physical defects that cause failures during execution of test-program instructions on CPU 80 may be detected in various ways, some more clever than others.

During chip design, some of the blocks in CPU 80 may be modeled while others have not been modeled. For example, ALU 94 may be modeled, while some logic in instruction decoder 92 is un-modeled or only partially modeled. The carry-in CIN from instruction decoder 92 to ALU 94 may not be modeled, and CIN may have an unknown state that is applied as an input to ALU 94.

When ALU 94 uses a fuzzy model, the unknown CIN from unmodeled logic within instruction decoder may be propagated through ALU 94, allowing other blocks such as register file 96 or flags 84 to be tested. With an unknown CIN the result is a number N or a number N+1. This fuzzy representation of the result allows for some checking of the result. Thus useful testing of ALU 94 may still be performed, even though the CIN input is unknown.

Figure 4:
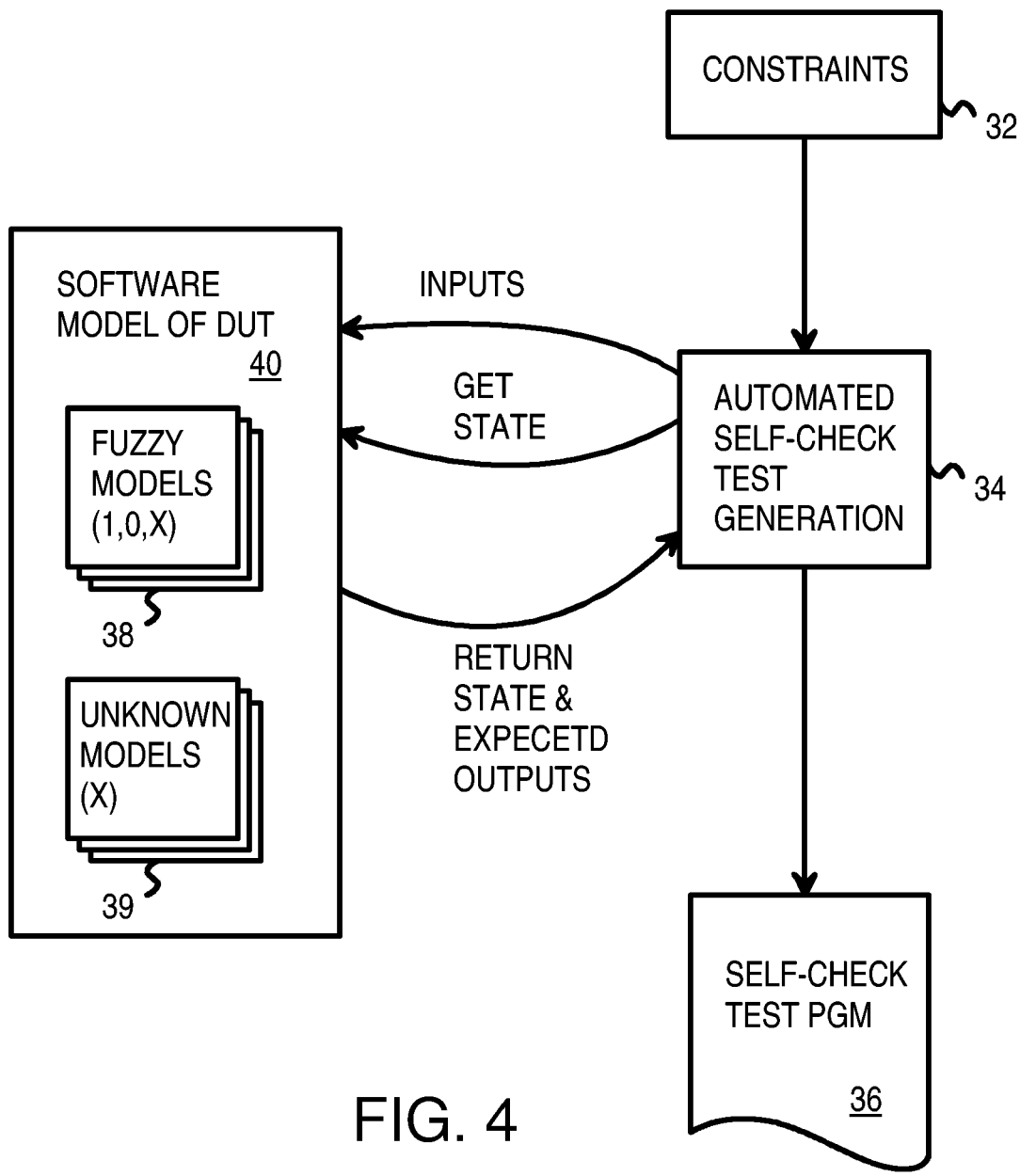
FIG. 4 is a high-level diagram of a self-checking test generator program that uses fuzzy logic models for generating expected outputs.

FIG. 4 is a high-level diagram of a self-checking test generator program that uses fuzzy logic models for generating expected outputs. Constraints 32 are input from the test engineer that direct or steer generation of test program 36 by self-checking test generator 34. Constraints 32 can include probabilities for specific actions. For example, to focus testing on a load-store unit, constraints may dictate that 90% of all generated instructions are loads and stores while 10% are branches. Another set of constraints may force 90% of operations to be math operations in order to test the ALU and floating point units. Constraints may also control modes of operations. For example, specifying that 10% of all tests run with the prefetch buffer turned on.

Self-checking test generator 34 uses random or other sequence generators to generate values for test inputs that are written as test inputs for vectors in test program 36. These test inputs are also applied to software DUT model 40. Software DUT model 40 is a software model of the device to be tested, used to predict results produced by the actual device under test (DUT). Software DUT model 40 can be created long before first prototypes of the device or chip are available.

Software DUT model 40 can be a higher-level model of the functions performed by blocks within the system chip being developed. For example, an adder could be represented by add functions and logic equations for other functions such as overflow and carry-in. Software DUT model 40 may be refined as the chip design progresses.

Software DUT model 40 includes fuzzy models 38 of blocks within the chip. Fuzzy models 38 are available for blocks that have been designed and modeled, while other blocks that have not yet been designed may not yet have fuzzy models 38 for these blocks. Some blocks may be so complex that a model is not available. These non-modeled or unknown blocks may have unknown models 39 that only define inputs and outputs, or only outputs. Logic operations within the unknown blocks are not modeled and are ignored. The outputs from unknown blocks are unknown and represented by their unknown models 39 as X's.

Fuzzy models 38 for blocks that have been designed and modeled allow inputs to be in one of three states—0, 1, X. When an input to fuzzy model 38 is in the unknown X state, all of the outputs from that fuzzy model 38 may also be placed in the unknown state. Alternately, a more precise fuzzy model 38 may block the unknown X input for some combinations of other inputs. For example, an AND gate within the fuzzy model 38 that receives a 0 input and an X input can block the X from propagating. Fuzzy model 38 may also model a set of possible output values without knowing exactly which value in the range will be output. For example, an adder with an unknown CIN but known operands A and B may output either A+B or A+B+1. Fuzzy models may propagate this set of possible outputs instead of all unknown.

Sequential or registered logic may be modeled by fuzzy models 38. The outputs for fuzzy models 38 for registered logic may not change until after a clock edge. State may be retained in the registers in fuzzy models 38. Self-checking test generator 34 can get the state of fuzzy models 38, which returns the current value of registers or other state-carrying memory elements in fuzzy models 38 to self-checking test generator 34. This allows generation of self checking instructions. For example, there may be two modeled registers, A and B, which contain known values of 15 and 13 respectively. Self-checking test generator 34 may be constrained to generate a branch-greater-than instruction (BGT) that should not be taken. The self-checking test generator gets the state of A and B, knows that A>B, and generates a self-checking instruction BGT B, A, FAIL. So, if B>A then the test is failed.

Self-checking test generator 34 can generate a sequence of test inputs to apply to software DUT model 40 and later apply to a device under test. Software DUT model 40 retrieves internal states of fuzzy models 38 in software DUT model 40 to achieve better test coverage of these states and deeply embedded logic. Outputs of internal blocks predicted by fuzzy models 38 are also returned with the state information. Some of these outputs may be for external device pins and thus be written as expected outputs to test program 36. For example, it may be modeled that an interrupt wire should be asserted.

The states of fuzzy models 38 returned by software DUT model 40 may be unknown, especially for unknown blocks. Self-checking test generator 34 may not yet be able to fully check results for these unknown blocks. However, self-checking test generator 34 still creates test stimulus for the un-modeled block. Failures will be detected if the un-modeled block causes other modeled blocks to fail or if the un-modeled block fails drastically, such as with a hang. This partial testing and checking is useful and may find many of the bugs in the un-modeled block. These failure modes are common with early designs before much testing has occurred. Eventually, if the un-modeled block becomes modeled, then full testing and checking may occur.

The self-checking test generator program receives expected outputs returned from fuzzy models 38 and writes these expected outputs to the test vectors in test program 36. Expected outputs for external pins are written to the test vectors, while internal expected outputs are not visible until they affect an external pin, such as when an internal memory is read or a flag causes a branch instruction to execute and halt program execution.

Figure 5:
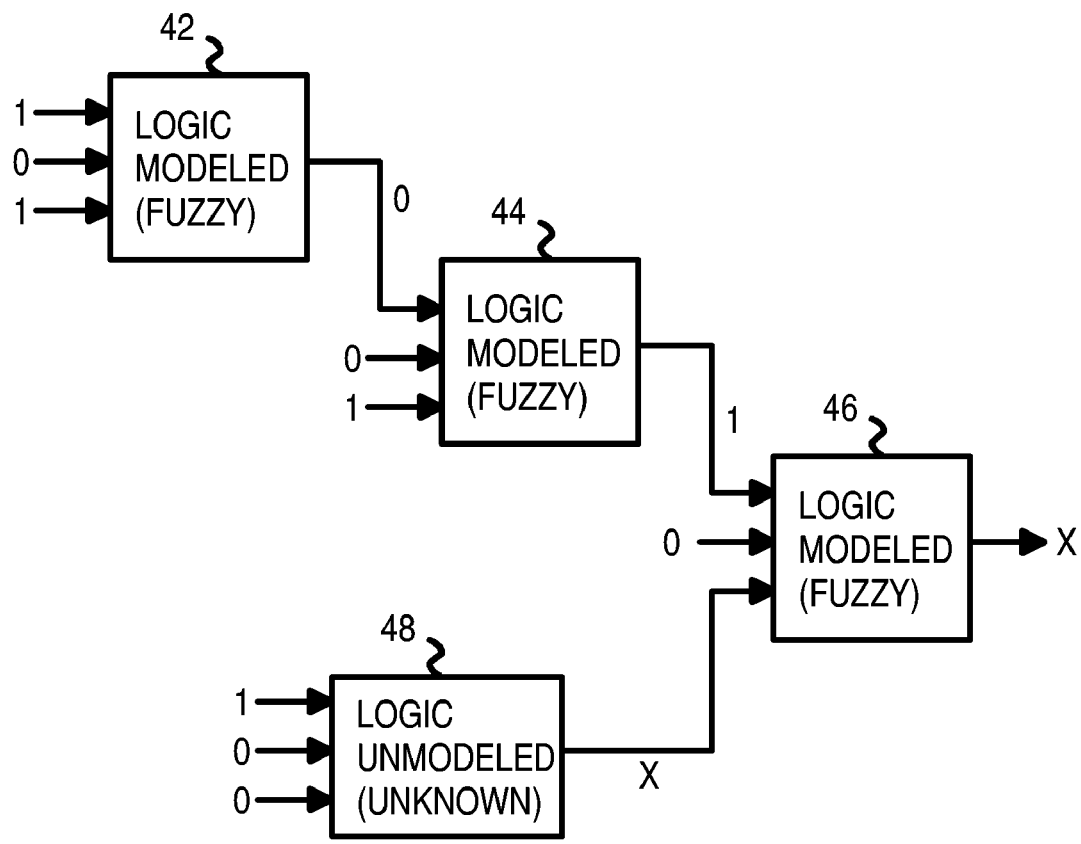
FIG. 5 shows propagation of unknown logic states through fuzzy models.

FIG. 5 shows propagation of unknown logic states through fuzzy models. Test inputs to blocks 42, 44, 46, 48 are generated by the self-checking test generator program, and are shown as 1's and 0's. Blocks 42, 44, 46 have been designed and modeled, and have outputs that can be predicted using the fuzzy models based on inputs to the block and the block's current state. The current state is a function of prior inputs to the block for sequential (state) logic, such as logic containing flip-flops, registers, or memory elements.

Deterministic states 1, 0 are output by models for blocks 42, 44, since all inputs to blocks 42, 44 are 1's and 0's. However, block 48 is an unknown model that outputs an X. Unknown models do not model behavior of the design; instead they always output X regardless of the inputs received.

Block 46 receives two deterministic inputs, 1, 0, from block 44 and from the test-program inputs. However, since the input from block 48 is unknown, X, the output of block 46 is also unknown. The fuzzy model for block 46 propagates the X on an input to the output. The fuzzy model explicitly defines what the output is (X in this case) when an unknown X input is received. Thus this single-bit fuzzy model accepts known state inputs 1, 0 as well as unknown inputs X, and has three acceptable output states—1, 0, X. When a fuzzy model input is X, the output may or may not be X. The fuzzy model for block 46 is an example where an X is output.

FIGS. 6A-C show an example of fuzzy models used by a self-checking test generator program. In FIG. 6A, the CIN output from unknown model 20' is unknown and has the logic value X. Random values are generated by the self-checking test generator program and applied to the multi-bit inputs to adder 10. The fuzzy model for adder 10 accepts the unknown CIN input and generates a multi-bit expected output that is latched by register 15 on the next clock edge. A carry-out COUT is also generated by adder 10 and latched into register 23.

The expected output in register 15 is modeled as:

$$EXP\_OUT = RND(A) + RND(B) + CIN$$

The expected output for adder 10 is the sum of the random multi-bit values generated from random values A, B, and the carry-in CIN. However, since CIN is X, the expected output can be reduced to:

$$EXP\_OUT = RND(A) + RND(B) + X$$

Since X is the single unknown bit that can be either 0 or 1:

$$EXP\_OUT = RND(A) + RND(B) + 0/1$$

It is possible for fuzzy logic to model a range of possible expected outputs. In the example where CIN is unknown, EXPECTED OUTPUT is a number (S or S+1) depending on CIN being 0 or 1 respectively. This partially known state may be modeled and propagated to other fuzzy models. If propagating a fuzzy range becomes too complex then it is possible to revert the value to unknown. FIG. 6B shows an example where only the last bit is unknown.

The fuzzy model for COUT register 23 usually will not be affected by an unknown CIN from unknown model 20'. The fuzzy model for COUT could assume CIN=0 and assign COUT according to RND(A) and RND(B) values. Then, COUT could be forced to be unknown only if the EXPECTED OUTPUT of RND(A)+RND(B)+0 is its maximum possible value. Any other EXPECTED OUTPUT value will have a modeled and known COUT value.

FIG. 6C shows pseudo code for a self-checking test generator program and a fuzzy model for the adder of FIG. 6A. Multi-bit inputs A, B are generated from values between 0 and 300 that are chosen based on constraints. For example, values could be chosen randomly or selectively from among prime-number values or interesting values such as 0000 or 1111.

In the fuzzy model, when CIN is X, both the COUT and multi-bit output from the adder model are unknown X. This is more restrictive than the model for FIG. 6B, since all bits are set to X, rather than just some of the output bits. When the inputs including CIN are known (not X), then the multi-bit expected output is:

$$A+B+CIN$$

and the carry-out (overflow) is generated from an overflow function (not shown).

FIG. 7 is a flowchart of operation of a self-checking test generator that uses fuzzy models. User constraints are loaded, step 102. User constraints steer or direct generation of the test program so that generation is not completely random.

Microprocessors can execute many different kinds of instructions within the microprocessor's instruction set. Other kinds of system chips also have instructions or pseudo-instructions defined by their architectures. Each instruction may have several variants, such as loading a 32-bit word rather than a 64-bit word, or branching on a condition code or flag or unconditionally.

The self-checking test generator program selects an instruction to add to the test program from among a list of instructions in the microprocessor's instruction set, step 104. The instruction selected must meet the user constraints.

During design of the microprocessor, some but not all blocks within the chip may be designed at any time. Blocks that have not yet been designed cannot be used. Some instructions may require these unfinished design blocks. Thus the self-checking test generator cannot add these instructions to the test program. The constraints to the test generator may be used to avoid generating test vectors for unfinished portions of the DUT.

For example, the basic design of the processor core may be done, including the arithmetic-logic-unit (ALU). Basic ALU instructions such as add, subtract, Boolean bit operations, etc., may be executed by the software DUT model and selected in step 104 for execution. However, other blocks such as a multiplier may not yet be designed, or may still have too many bugs to be tested or to be modeled. Instructions that require the multiplier block cannot yet be executed on the software DUT model. Instructions such as a multiply instruction do not have resources available in the software DUT model and thus fail step 106.

When resources for the selected instruction are not available, step 106, then the self-checking test generator checks to see if any more instructions in the instruction set are available and have not yet been added to the test program, step 116. One of these un-used instructions can be selected in step 104 for testing.

When resources for the selected instruction are available, step 106, then the self-checking test generator checks to see if the selected instruction requires a known state in the software DUT model. Some instructions do not require any known state to exist. For example, the test instruction "MOV R0, 15" assigns register R0 the value of 15. No known state is needed for this instruction. Indeed, this instruction creates a known state from a potentially unknown state in register R0. Other instructions need a known state to operate correctly. For example a "BR OVERFLOW, PASS" instruction branches to PASS if the OVERFLOW flag is set from the last ALU operation. This instruction will only have predictable behavior when the value of the OVERFLOW flag is known. Thus a known state is required by the branch instruction but not by the move instruction in these examples.

Instructions that require a known state in the software DUT model could include a branch on flag instruction that requires a known state of a flag. If the flag is in the unknown state, the branch cannot be resolved as taken or not taken, and the branch instruction cannot be executed or added to the test program. Another example is a store instruction where a register contains the store address. If the register is unknown then the store may overwrite important data such as code in memory or a translation-lookaside buffer (TLB) page table. This type of store instruction can be generated only when the register with the address is known to have an allowable set of values. Step 114 fails when a known state is not available for an instruction that requires a known state. Then another instruction may be selected, steps 116, 104.

The known state could be for memory, registers, data structures (e.g. data cache, translation-lookaside buffer TLB), counters, or state-machine status.

Some selected instructions may not require a known state. For example, an unconditional branch does not require a known state of the flags, since the branch is always taken.

When the selected instruction does not require a known state, step 108, or when the known state required by the selected instruction is available, step 114, the selected instruction can be executed on the software DUT model, step 110. Resources that are needed by the instruction to be executed are allocated. The states of blocks used by the selected instruction are updated within the software DUT model. The selected instruction is added to the test program, step 112, by creating a test vector for writing the instruction word to the instruction cache. This test vector is added to the test program. If the instruction writes a result to the processor's memory, further test vectors could be added to read this result from the processor's memory and to compare the result to an expected result generated by the self-checking test generator program. Alternately, additional instructions could be selected by the self-checking test generator program to perform the result comparison within the microprocessor and the software DUT model, followed by a branch on mis-compare instruction that would signal a result mismatch failure of the test program on the DUT.

After processing the selected instruction, another instruction may be selected if any instructions remain that have not yet been processed by the self-checking test generator program, step 116. When all available instructions have been processed, step 116, then the self-checking test generator program finishes, step 118. The test program generated by the self-checking test generator program may be used to test a pre-silicon testbench DUT or a post-silicon chip DUT.

Since there may be hundreds of basic instruction types in an instruction set, and as many as a dozen variants of each instruction, the length of the test program generated may be quite long. Therefore the amount of time and effort by test engineers that can be saved using the self-checking test generator program is significant.

Step 104 may also select a macro or set of instructions to generate. It is useful to generate a specific sequence of interesting instructions and the macro concept allows for this. In steps 106 and onward all the resources required by the macro are available and allocated before the macro makes it into the test in step 110. In step 110 all states are updated in the DUT model for this MACRO. In step 112 all instructions in the MACRO are added to the generated test.

Figure 8:
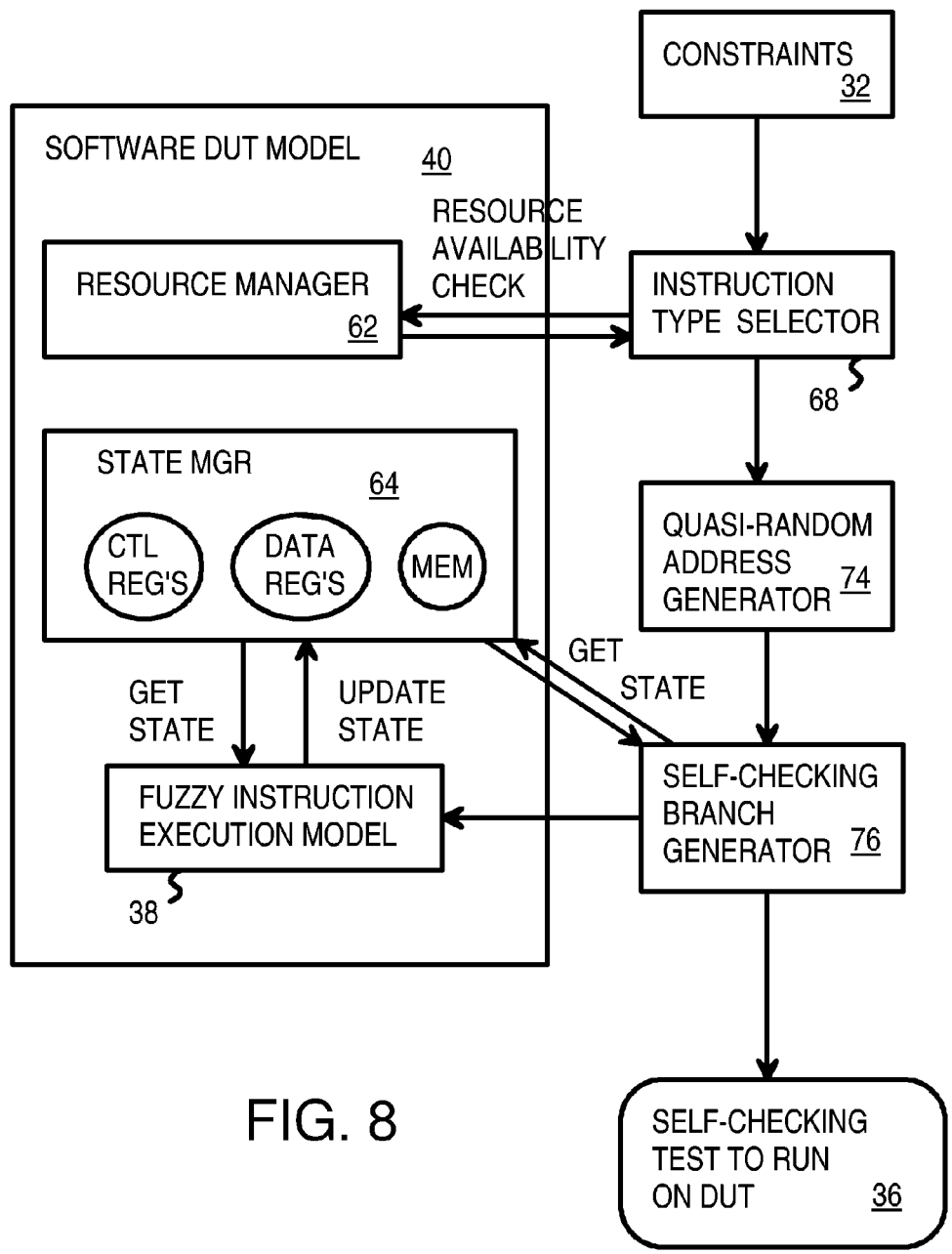
FIG. 8 is a mid-level block diagram of a self-checking test generator program using a software DUT model to generate a self-checking test program.

FIG. 8 is a mid-level block diagram of a self-checking test generator program using a software DUT model to generate a self-checking test program. Instruction-type selector 68 selects an instruction for processing from a list of instruction types that can be executed by software DUT model 40 and the DUT. The selection is limited by user constraints 32.

Some instructions require the DUT to have a certain state. For example, a store instruction may require a register to contain a known virtual address. If no registers contain a known virtual address then the store is abandoned. Another example is a conditional branch that must be taken. The branch is only generated if there is a register with some known state. So this instruction would be abandoned unless there is at least 1 known register. To solve these types of problems instruction type selector 68 queries resource manager 62 if the correct state exists for the selected instruction.

Many instructions have inputs known as operands. The operands may be fixed values, variables stored in a register file, or an address pointer to a variable stored in memory. A wide variety of operands and addressing modes are known and could be used by some instructions. Quasi-random address generator 74 generates operand values to be used with the selected instruction, and/or address pointer values or register pointer values. The self-checking test generator program can add instructions or sequences to the self-check test program to load memory or the register file at these pointer locations with desired variables. Both the variables and the pointers may be generated by quasi-random address generator 74 within limits, such as within a memory block or range limits of variables. Rather than select all values at random, quasi-random address generator 74 may select more interesting values, such that the level-1 data-cache evicts lines more often or such that TLB misses occur more often.

The self-checking test program may perform self-checks by adding branch or other instructions to the list of instructions that the DUT executes. The branch instruction could compare a result in a register written by a prior instruction to an expected value, and branch to an error routine if a mismatch occurs. For this reason, self-checking instructions like branches need known state. For example, if a register value is known, then a branch if equal (BEQ) may be used to check that the DUT and the software DUT model have the same value in the register. Branches may also check fuzzy state. For example, if a value is unknown, but is within a range of values which are all positive, then a branch greater than zero may still perform partial checking on this fuzzy state.

Self-checking branch generator 76 adds these extra instructions, such as the branch and expected-result loads and compares, to the sequence of instructions being generated and eventually added to test program 36.

Since some instructions, especially branches, require that software DUT model be in a known state before execution, self-checking branch generator 76 queries state manager 64 in software DUT model 40 to determine if the required blocks are in known or unknown states. When a signal used by the instruction is in an unknown state, such as a flag used by a branch, the sequence of instructions cannot be added to test program 36.

State manager 64 contains state variables of software DUT model 40, such as values in data and control registers, flip-flops, latches, memory, etc. that correspond to those present in the DUT. Typically these are clocked by a microprocessor clock and can change only in response to a clock edge.

The combinatorial logic in the DUT is modeled in software DUT model 40 by fuzzy models 38. Fuzzy models 38 receive chip inputs from test vectors, and the prior state from state manager 64 as inputs, and generate chip outputs and the next state that is stored by state manager 64 with each clock edge. Thus fuzzy models 38 can contain the logic gates (combinatorial logic) part of a design while state manager 64 contains the registers (sequential logic) in a design.

Some of the state signals in state manager 64 may be unknown while others are known. Fuzzy models 38 propagate unknown signals that may again be stored in state manager 64. Unmodeled logic in the design may have an unknown model that only lists inputs and outputs, and drives all outputs as unknowns. Together, the fuzzy models and the unknown models form the fuzzy instruction execution model that mimics the behavior of the target design under test. The instruction execution model may update the state manager with known and unknown values. The unknown values may be completely unknown or may have a sub-set or range of possible values.

Each instruction may require only one clock, or may require many clocks for execution. The clock may be a higher-level clock or a lower-level clock that pulses more frequently. Various combinations of clocks may be used.

ALTERNATE EMBODIMENTS

Several other embodiments are contemplated by the inventor. For example components may be arranged and re-arranged in a variety of ways, and combined or divided. Steps in a flow or process may be re-ordered, combined, or sub-divided. While the terms pre- and post-silicon have been used, the invention could be applied to chips that are not made from silicon, such as gallium-arsenide and other materials. Blocks with un-modeled logic could initially have unknown models that just list input and output, but have no logic inside and drive all outputs as unknowns (X). These unknown models later could be replaced by fuzzy models that emulate the logic operations of the block to generate modeled outputs in 1, 0, or X states. Some logic blocks may never be fully modeled and remain as unknown models, while other blocks may eventually have a functional fuzzy model written for them.

An embodiment uses fixed constraints and pseudo-random-number generation to select test instructions. Rather than using random selection, a genetic algorithm or some other algorithms could be used to pick the selected instruction. Furthermore, the constraints could be dynamic and change based on the state of the DUT model.

An embodiment includes generating one instruction at a time, checking that resources are available, and adding this instruction to the test. Alternately, groups or sets of instructions could be processed together. Instruction grouping may be useful for causing specific sequences of test events to occur together, which is especially useful in testing. Instructions may contain a mix of checking instructions and non-checking instructions.

Blocks may be large units of the design, intermediate units, or smaller units such as low-level logic, circuits, gates, etc. Modeling may be performed on various levels. Some blocks may have sub-blocks or sub-models.

Self-testing logic on the chip may be used by the self-checking test program, such as a built-in-self-test (BIST) controller. Scan logic may be used to enter variables and instructions, or to read results out of the chip. The system chip being tested may have several processor cores that can each be tested. Instructions could be loaded into the chip once and copied to multiple instruction caches for multiple processor cores.

Rather than model just three binary states 0, 1, X, fuzzy models could model additional states such as ranges of values, high-impedance (Z), multiple drives on a line, etc. Multi-bit values may also be substituted. Various chip-resetting methods may be used by the self-checking test generator. Additional test vectors may be added to test memory, registers, etc. Some instruction sets may use more complex instructions that may be two or more instructions in simpler instruction sets. For example, the selected instruction and the self-check instruction could be combined into one instruction for some complex instruction sets.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A self-checking test generation system comprising:
   a computer with one or more processors and a memory storing a program of instructions executable by the one or more processors, the program of instructions comprising a self-checking test generator comprising:
   a device-under-test (DUT) model of a target device, the DUT model having interconnected models for modeling interconnected blocks of the target device;
   a plurality of fuzzy models, each fuzzy model being a model of operation of one of the interconnected models in the DUT model;
   a plurality of unknown models in the DUT model, each unknown model outputting one or more model outputs in an unknown logic state;
   wherein a fuzzy model that receives a model output from an unknown model propagates the unknown logic state for at least some combinations of model inputs to the fuzzy model;
   a state storage that receives model outputs from the plurality of fuzzy models, the state storage storing state signals;
   an instruction writer that writes a selected instruction, operand or pointer values, and a self-check instruction to a self-check test program, the self-check test program for executing on the target device for testing the target device,
   whereby the self-check test program is generated using the fuzzy models.

2. The self-checking test generator of claim 1 further comprising:
   an instruction selector for selecting the selected instruction from a plurality of instructions intended for executing on the target device;
   a resource manager that determines when an operation determined by the selected instruction is capable of being executed by the plurality of fuzzy models wherein resources required by the selected instruction are not contained in the plurality of unknown models;
   a value generator that generates operand or pointer values for use by the selected instruction; and
   a self-check instruction generator that generates the self-check instruction to verify a result generated by the selected instruction;
   wherein the instruction selector selects a different instruction from the plurality of instructions when the resource manager determines that the operation determined by the selected instruction requires an unknown model in the plurality of unknown models, the instruction writer not writing selected instructions to the self-check test program for selected instructions that require unknown models,
   whereby instructions that perform operations that require unknown models are not added to the self-check test program.

3. The self-checking test generator of claim 2 wherein unknown logic states output by the plurality of unknown models are stored in the state storage;
the self-checking test generator further comprising:
a state checker that reads the state storage to determine when a state required by the self-check instruction is stored as an unknown logic state in the state storage;
wherein the instruction selector selects a different instruction from the plurality of instructions when the state checker determines that the self-check instruction requires an unknown logic state in the state storage, the instruction writer not writing selected instruction or the self-check instruction to the self-check test program for self-check instructions that require unknown logic states,
whereby instructions requiring unknown logic states are not added to the self-check test program.

4. The self-checking test generator of claim 2 wherein the target device is a processor that executes instructions in an instruction set that includes the plurality of instructions.

5. The self-checking test generator of claim 4 wherein the self-check instruction is a branch instruction that branches to indicate a manufacturing defect or bug in the target device when a result generated by execution of the selected instruction does not match an expected result.

6. The self-checking test generator of claim 5 wherein the expected result is generated by the plurality of fuzzy models in response to execution of the selected instruction using the operand or pointer values generated by the value generator;
wherein the unknown logic state is an unknown value, a range of two or more possible values, or a set of two or more possible values.

7. The self-checking test generator of claim 6 wherein the instruction writer also writes a compare instruction to the self-check test program, the compare instruction for comparing the result of execution of the selected instruction to the expected result to set a condition flag read by the branch instruction to determine when to branch.

8. The self-checking test generator of claim 1 wherein unknown logic states propagated to chip outputs of the DUT model are indicated as non-compare signals within expected outputs of the self-check test program.

9. The self-checking test generator of claim 1 wherein the state storage emulates control registers, data registers, or memory on the target device.

10. A computer-implemented method for generating a self-check test program comprising:
selecting a selected instruction from a plurality of instructions in an instruction set for executing on a target device that is an intended device-under-test (DUT);
determining when necessary blocks in the target device are available as fuzzy models in a software DUT model that emulates operation of the target device;
skipping and not executing the selected instruction on the software DUT model and not adding the selected instruction to the self-check test program when the necessary blocks are determined to be unavailable as fuzzy models in the software DUT model;
when the necessary blocks are determined to be available as fuzzy models in the software DUT model, determining when a known state is required for the selected instruction;
skipping and not executing the selected instruction on the software DUT model and not adding the selected instruction to the self-check test program when the known state is required but not available on the software DUT model;
executing the selected instruction on the software DUT model to generate an updated state and adding the selected instruction to the self-check test program when the known state is required and available on the software DUT model or when the known state is not required; and
continuing to select and process other instructions from the plurality of instructions in the instruction set as the selected instruction to generate the self-check test program,
whereby the self-check test program is generated by selecting instructions that have fuzzy models available on the software DUT model.

11. The computer-implemented method of claim 10 wherein the software DUT model also comprises unknown models that generate model outputs in an unknown state;
wherein the unknown models are for blocks in the target device that have not yet been modeled or have not yet been designed;
wherein the fuzzy models are for blocks in the target device that have already been modeled or designed;
wherein the unknown models generate model outputs in an unknown state;
wherein model inputs to fuzzy models are previously-stored state signals, test inputs from test vectors, model outputs from other fuzzy models, or model outputs from unknown models.

12. The computer-implemented method of claim 11 wherein the fuzzy models accept as model inputs known states and accept as model inputs the unknown state generated by the unknown models.

13. The computer-implemented method of claim 12 wherein the fuzzy models propagate unknown states applied to model inputs to model outputs, but propagate known states to model outputs when all model inputs are in known states;
wherein known states for a bit are 1 and 0 and the unknown state for the bit is X to indicate that it is unknown whether the bit is 1 or the bit is 0.

14. The computer-implemented method of claim 10 further comprising:
replacing an unknown model with a fuzzy model after a block has been designed and modeled,
whereby unknown models are updated with fuzzy models after design and modeling of blocks in the target device.

15. The computer-implemented method of claim 10 wherein executing the selected instruction on the software DUT model comprises:
reading a current state of state storage in the software DUT model;
applying the current state of state storage as model inputs to the fuzzy models;
performing logic operations on the model inputs to generate model outputs of the fuzzy models, wherein the logic operations are determined by the fuzzy models; and
updating the state storage in the software DUT model in response to the model outputs to generate a next state of the state storage.

16. The computer-implemented method of claim 15 wherein execution of the selected instruction further comprises generating a result that is written to the state storage;
further comprising:
executing a sequence of checking instructions after execution of the selected instruction that generates the result;
wherein the sequence of checking instructions comprises:
a load instruction that loads an expected value;
a compare instruction that compares the expected value to the result; and a branch instruction that branches to indicate a faulty DUT when the result does not match the expected value;

wherein the sequence of checking instructions is added to the self-check test program when the selected instruction is added to the self-check test program, whereby the self-check test program is self-checking.

17. The computer-implemented method of claim 10 further comprising:

generating operand values and address pointer values for inclusion in the selected instruction;

loading constraints that direct selection of the selected instruction; and selecting the selected instruction in response to constraints wherein the selected instruction meets the constraints.

18. A computer-program product comprising:

a computer-readable storage medium storing computer executable program code means, which when executed on a computing device generates a self-check test program, the computer executable program code means in the computer-program product comprising:

software device-under-test (DUT) model code means for modeling operation of a target device, the target device being an intended DUT for testing by the self-check test program;

fuzzy model code means, in the software DUT model code means, for modeling operation of blocks in the target device that have been designed and modeled, the fuzzy model code means accepting as model inputs known states and accepting as model inputs an unknown state;

unknown model code means, in the software DUT model code means, for generating model outputs in the unknown state for blocks in the target device that have not yet been logically modeled;

wherein the fuzzy model code means are further for propagating the unknown state generated by the unknown model code means to model outputs, and for propagating known states to model outputs when all model inputs are in known states;

the fuzzy model code means propagating the unknown state to model outputs for at least some combination of values of model inputs when the unknown model code means drives the unknown state to a model input of the fuzzy model code means;

instruction select code means for selecting a selected instruction from a plurality of instructions in an instruction set for executing on the target device;

resource checking code means for determining when necessary blocks in the target device are available in the fuzzy model code means in the software DUT model code means that emulates operation of the target device;

first bypass code means for skipping and not executing the selected instruction on the software DUT model code means and not adding the selected instruction to the self-check test program when the necessary blocks are determined to be unavailable in the fuzzy model code means;

state checking code means, activated when the necessary blocks are determined to be available in the fuzzy model code means, for determining when the known states are required for the selected instruction;

second bypass code means for skipping and not executing the selected instruction on the software DUT model code means and not adding the selected instruction to the self-check test program when the known state is required but not available on the software DUT model code means;

execution code means for executing the selected instruction on the software DUT model code means to generate an updated state and for adding the selected instruction to the self-check test program when the known state is required and available on the software DUT model code means or when the known state is not required; and looping code means for continuing to select and process other instructions from the plurality of instructions in the instruction set as the selected instruction to generate the self-check test program, whereby the self-check test program is generated by selecting instructions that have the fuzzy model code means available on the software DUT model code means.

19. The computer-program product of claim 18 further comprising:

state storage code means, responsive to a clock, for storing the known states and the unknown state generated by or propagated by the fuzzy model code means;

wherein the state checking code means is further for reading the state storage code means to determine when the known states are required for the selected instruction.

20. The computer-program product of claim 18 further comprising:

pseudo-random value generation code means for generating operand values for inclusion in the selected instruction, the operand values generated pseudo-randomly while limited by constraints.

* * * * *